(12) United States Patent
Lin et al.

(10) Patent No.: US 8,980,741 B2
(45) Date of Patent: Mar. 17, 2015

(54) THROUGH SILICON VIA WITH EMBEDDED BARRIER PAD

(71) Applicant: Taiwan Semiconductor Manufacturing Company, Ltd., Hsin-Chu (TW)

(72) Inventors: Yung-Chi Lin, Su-Lin (TW); Sylvia Lo, Hsin-Chu (TW); Jing-Cheng Lin, Chu Tung Zhen (TW); Yen-Hung Chen, Hsin-Chu (TW); Wen-Chih Chiou, Zhunan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/299,886

(22) Filed: Jun. 9, 2014

(65) Prior Publication Data

US 2014/0287581 A1 Sep. 25, 2014

Related U.S. Application Data

(62) Division of application No. 13/457,841, filed on Apr. 27, 2012, now Pat. No. 8,772,945.

(51) Int. Cl.
*H01L 21/44* (2006.01)
*H01L 21/768* (2006.01)
*H01L 23/48* (2006.01)
*H01L 23/00* (2006.01)

(52) U.S. Cl.
CPC ........ *H01L 21/76898* (2013.01); *H01L 23/481* (2013.01); *H01L 24/03* (2013.01); *H01L 24/05* (2013.01); *H01L 21/7685* (2013.01); *H01L 21/76877* (2013.01); *H01L 2224/05099* (2013.01); *H01L 2224/0346* (2013.01); *H01L 2224/0401* (2013.01); *H01L 2224/04042* (2013.01); *H01L 2224/04073* (2013.01); *H01L 2224/05025* (2013.01); *H01L 2224/05026* (2013.01); *H01L 2224/05155* (2013.01); *H01L 2224/05157* (2013.01); *H01L 2224/05166* (2013.01); *H01L 2224/05181* (2013.01); *H01L 2224/05571* (2013.01); *H01L 2224/05599* (2013.01); *H01L 2224/05624* (2013.01); *H01L 2224/05644* (2013.01); *H01L 2224/05647* (2013.01); *H01L 2224/05655* (2013.01); *H01L 2224/05684* (2013.01); *H01L 2224/03616* (2013.01); *H01L 2224/05541* (2013.01)
USPC ............................. 438/653; 438/652; 438/660

(58) Field of Classification Search
USPC .......................................... 438/652, 653, 660
See application file for complete search history.

(56) References Cited

U.S. PATENT DOCUMENTS

| 2011/0193199 A1 | 8/2011 | Filippi et al. | |
|---|---|---|---|
| 2011/0316169 A1* | 12/2011 | Sunohara et al. | 257/774 |
| 2012/0133030 A1* | 5/2012 | Wang et al. | 257/621 |

*Primary Examiner* — David Vu
*Assistant Examiner* — Brandon Fox
(74) *Attorney, Agent, or Firm* — Slater and Matsil, L.L.P.

(57) ABSTRACT

A system and method are disclosed for providing a through silicon via (TSV) with a barrier pad deposited below the top surface of the TSV, the top surface having reduced topographic variations. A bottom TSV pad is deposited into a via and then polished so the top surface is below the substrate top surface. A barrier pad is then deposited in the via, and a top TSV pad deposited on the barrier pad. The top TSV barrier pad is polished to bring the top surface of the top TSV pad about level with the substrate. The barrier pad may be less than about 1 microns thick, and the top TSV pad may be less than about 6 microns thick. The barrier pad may be a dissimilar metal from the top and bottom TSV pads, and may be selected from a group comprising titanium, tantalum, cobalt, nickel and the like.

20 Claims, 4 Drawing Sheets

_US 8,980,741 B2_

THROUGH SILICON VIA WITH EMBEDDED BARRIER PAD

PRIORITY CLAIM AND CROSS-REFERENCE

This application is a divisional of U.S. patent application Ser. No. 13/457,841, filed Apr. 27, 2012, titled "Through Silicon Via with Embedded Barrier Pad," which applications is incorporated herein by reference in its entirety.

BACKGROUND

Generally, one of the driving factors in the design of modern electronics is the amount of computing power and storage that can be shoehorned into a given space. One method used to pack more computing power into a given space and reduce the distance between various chips forming a system is to stack chips, with interconnects running vertically. Embedded interconnects, or metal filled vias in a substrate, are commonly called through silicon vias ("TSVs"). TSVs can be used to connect chips on opposite sides of a substrate, or provide chip level connections through the body of the chip.

TSVs are also used to create 3D integrated circuits, and are advantageous over wire bonding or other connection techniques because the density of the vias is substantially higher, and because the length of the connections is shorter. A 3D package such as System in Package, Chip Stack Multi-Chip Module (MCM), etc. contains two or more chips (integrated circuits) stacked vertically so that they occupy less space and/or have greater connectivity. An alternate type of 3D package is Silicon Carrier Packaging Technology, where ICs are not stacked but a carrier substrate containing TSVs is used to connect multiple ICs together in a package. In most 3D packages, the stacked chips are wired together along their edges and this edge wiring slightly increases the length and width of the package and usually requires an interposer layer between the chips. In some 3D packages, through-silicon vias replace edge wiring by creating vertical connections through the body of the chips. The resulting package has no added length or width. Because no interposer is required, a TSV 3D package can also be flatter than an edge-wired 3D package. This TSV technique is sometimes also referred to as TSS (Through-Silicon Stacking or Thru-Silicon Stacking.) A 3D integrated circuit (3D IC) is a single integrated circuit built by stacking silicon wafers and/or dies and interconnecting them vertically so that they behave as a single device. By using TSV technology, 3D ICs can pack a great deal of functionality into a small footprint. The different dies in the stack may be heterogeneous, e.g. combining CMOS logic, DRAM and III-V materials into a single IC.

The use of silicon as an interposer or substrate is not required, even though the term refers to the vias being in silicon. These interposer substrates are commonly silicon, glass or some other insulator, with copper, gold or other conductors disposed in the vias through the interposer.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION

The making and using of the present embodiments are discussed in detail below. It should be appreciated, however, that the present disclosure provides many applicable concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely through silicon via (TSV) construction. Other embodiments may also be applied, however, to other electrical structures, including, but not limited to, conductive interconnects, redirection layers, ball grid arrays, die mounting structures, or any other conductive structure. Additionally, while the presented principles are described with reference to providing a TSV having a barrier pad and being disposed in a substrate used in package level processing, such as flip chip packaging, skilled artisans will recognize that that the same principles may be advantageously applied to other scales as well. The presented principles may be applied to, for example, higher level packaging, such as printed circuit boards, or to die level manufacturing, such as vias disposed in semiconductor substrate material as connections through the body of the chip as used in 3D packages or 3D integrated circuits to replace edge wiring interconnect systems.

The present inventive concepts are directed to providing embedded interconnects, or through silicon vias, with a barrier pad to reduce surface distortions. A barrier pad may be disposed under a conductive pad in the TSV at a depth sufficient to reduce the average size of metallic crystals in the surface conductive pad, and create a smoother surface for attaching interconnects.

Figure 1A:
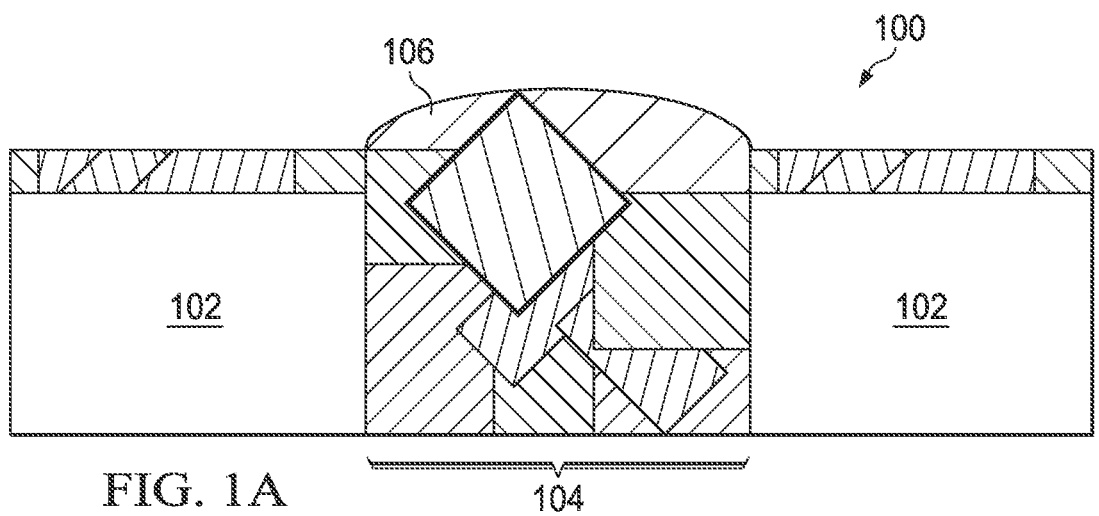
FIG. 1A is a cross-sectional diagram illustrating typical deposition of TSV material on a substrate.

With reference now to FIG. 1A, a cross-sectional diagram of a typical deposition of TSV material on a substrate 100 is shown. A TSV 104 is formed when a via is formed in a substrate 102 and a conductive TSV material 106 is deposited on the substrate 102. Ideally, TSV material 106 should completely fill the via. Voids or other physical imperfections in the filling of the via by the TSV material 106 may alter the conductive properties of the TSV 104. In depositing individual layers of TSV material 106, it is preferable to have the TSV material fill the length and width of the via.

A TSV 104 commonly has a diameter between 1 and 20 microns. However, a TSV 104 may have a diameter with any appropriate size. TSVs 104 may be intended to carry a particular current, and thus, an appropriate minimum diameter may be determined based in the height of the TSV 104 (and by extension, the thickness of the substrate 102), the resistance of the TSV material 106, and the required current capacity. Additionally, the maximum diameter of a TSV 104 is only practically limited by the desired density of TSVs 104.

TSV material 106 may consist of a variety of conductive materials as well. Skilled artisans will recognize that copper (Cu) TSV material 106 may be a commonly used TSV material 106, and is advantageous due to its low cost. Alternatively, gold (Au), palladium (Pd), nickel (Ni), gold-nickel alloy (AuNi), titanium (Ti), aluminum, (Al) or any other sufficiently conductive material may also be advantageously used as a TSV material 106.

One feature displayed in metallic TSV material 106 is a metallic grain structure. Any piece of metal is made up of a large number of crystal grains, which are regions of regularity in the packing structure of the metallic atoms. At the grain boundaries, atoms become misaligned creating irregularities known as dislocations. Metallurgical processing such as alloying, cold working, annealing, and tempering can change the arrangement and size of metallic grains. Cold working, for example, breaks up the larger grain structures making a metal harder and more brittle, while annealing uses heat followed by slow cooling to soften the metal through the growth of large grain structures.

Copper (Cu), aluminum (Al), silver (Ag) and gold (Au) form metallic crystal structures with a face centered cubic lattice, resulting in cubic, octahedron, dodecahedron and related crystal morphologies. In contrast, titanium (Ti), zinc (Zn) and cadmium (Cd) form hexagonal crystal lattices, while tungsten (W) and molybdenum (Mo) form body centered cubic crystal lattices. While some metals form the same type of lattice, it should be noted that the spacing of the lattices can be different, creating crystal structure discontinuities at the interface then two metals are deposited together. Therefore, the metal type may dictate the crystal lattice, which may, in turn dictate the average size and shape of the metallic grain structures in a TSV 104. Any "seeding", or influence of the metallic grain structure by pre-existing chemistry, may also affect the average grain size of a metal used in a TSV 104.

TSV material 106 may be deposited in any suitable manner, including, but not limited to electroplating, immersion, chemical vapor deposition, sputtering, plasma enhanced chemical vapor deposition, or the like. However, the deposition method may dictate the formation and physical qualities of grain boundaries in the TSV material 106. The size and geometry of the via may also dictate the size and physical qualities of the crystal grains developed in the TSV material. For example, a narrow diameter via will have smaller average grain structures than a wider via.

Electroplating copper (Cu) is an inexpensive method for depositing an inexpensive material to form a TSV 104. In such a process, TSV material 106 may be deposited in a TSV 104 and on a substrate 102 target surface at the same time, as shown. With the deposition of TSV material 106 extending above the surface of the substrate 102, one or more grain structures may sit proud, or extending above, the substrate's 102 upper, or target surface.

Figure 1B:
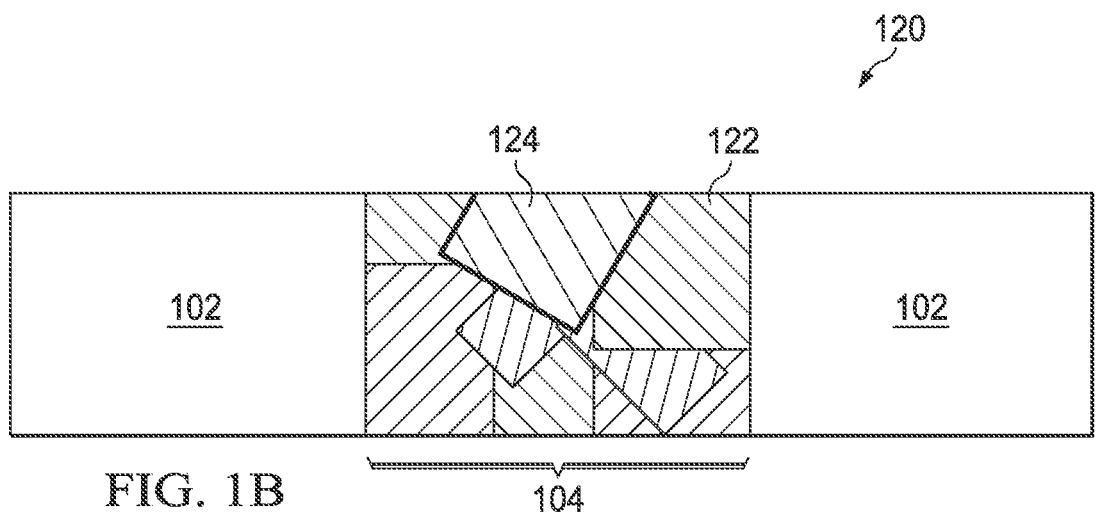
FIG. 1B is a cross-sectional diagram illustrating a typical TSV and substrate after polishing.

Referring now to FIG. 1B, a cross sectional view illustrating a cross-sectional view of a TSV and substrate after polishing 120 is depicted. In instances where TSV material 106 is deposited on the substrate and in the via, the TSV material 106 may be ground or polished so that the polished TSV material 122 in the TSV 104 and the substrate form a flat, uniform surface. This may be accomplished by mechanical or chemical-mechanical polishing. However, one issue encountered when polishing metals having large grain structures is that individual crystal grains may be sheared at the polish interface, or may be compressed and/or rearranged in the crystalline metal matrix. The proud grain 124, is displaced into the polished TSV material 106, and is also shown as being sheared, where the regular grain structure has been disrupted.

Figure 1C:
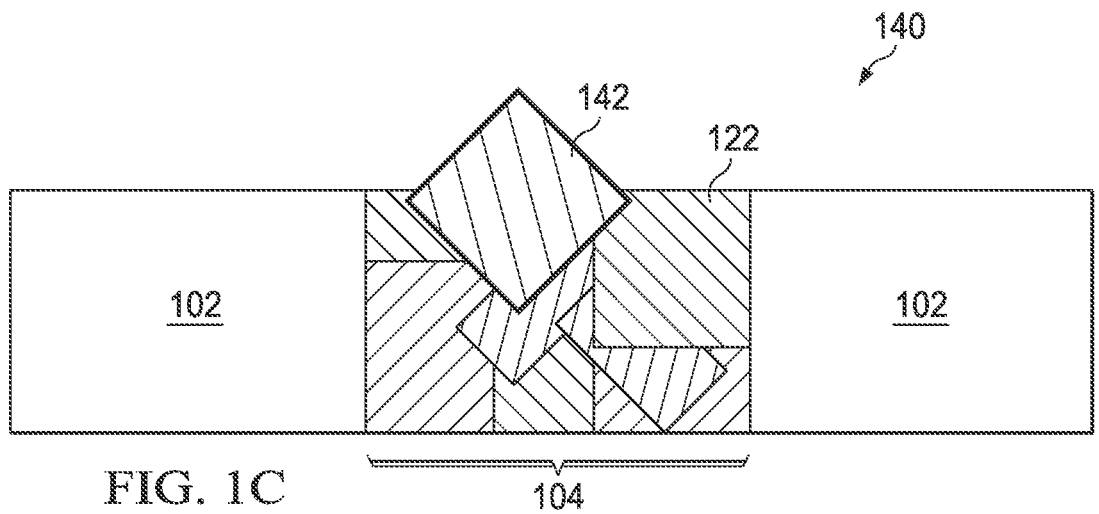
FIG. 1C is a cross-sectional diagram illustrating surface diffusion and grain reorientation in a typical TSV.

FIG. 1C is a cross-sectional view of a TSV 104 exhibiting surface diffusion and grain reorientation 140. During processing of semiconductor material, including semiconductor substrates having TSVs 104, substrates 102 are frequently heated to temperatures affecting the metallic structure of the TSV 104. For example, after doping, a semiconductor may be heated to drive in any deposited doping substances. Alternatively, annealing of semiconductor wafers is a common practice where a wafer or other substrate is heated and slowly cooled to relieve stress in, and soften, the semiconductor substrate.

The surface finishing of TSV material 106 to smooth the TSV 104 surface and level it to the substrate target surface 102 creates stresses in the metallic grain structures, particularly at the surface. Heating the substrate 102 and TSV 104 during processing allows the metallic grain structure to become more mobile, relieving the stresses in the metallic grain structure. The grain structures 142 are able to move into a position, and re-form structures, requiring less energy to maintain the new position or structure. For example, a portion of the proud grain structure 142 has risen above the plane of the substrate 102 surface and polished TSV 122 surface due to the mobility permitted by heat processing of the structure. This may be a grain structure 142 that was dislocated during the polishing process, combined with the heat of processing allowing the grain to return to a less energetic location. Alternatively, the grain structure 142 may have been cut, abraded or otherwise removed. In such an instance, heat treating may allow reformation of the grain structure, resulting in a proud grain structure 142.

The top of a polished TSV surface 122 may be used as a pad for mounting wire bonds, other metal mounting pads, solder pads, solder balls, redirection layers, or any other conductive interface. In order for a wire bond, solder ball or other metal-to-metal connection to bond effectively, a polished TSV surface 122 will ideally be as smooth as possible. Generally, the smoother the target surface, the better the bond. While the smallest polished TSV surface 122 features are desirable, there is some tolerance for surface irregularities or topography variations, the size of such topography variations is dependent on the size of the features in the device. For example, in devices created with 20 nanometer fabrication processes, surface features or topography variations less than about 100 angstroms may be tolerable, while in devices created with 45 nanometer fabrication processes, surface features or topography variations less than about 500 angstroms may be tolerable.

Providing the smoothest possible TSV surface allows a higher yield in package production when mounting electrical conductors to a polished TSV surface. The presented principles are directed to providing a TSV structure with smaller grain structures that cause less surface distortion on the TSV. In particularly useful embodiments, a barrier pad may be deposited below the surface of the TSV to prevent the formation of large scale grain structures at the surface of the TSV.

Figure 2A:
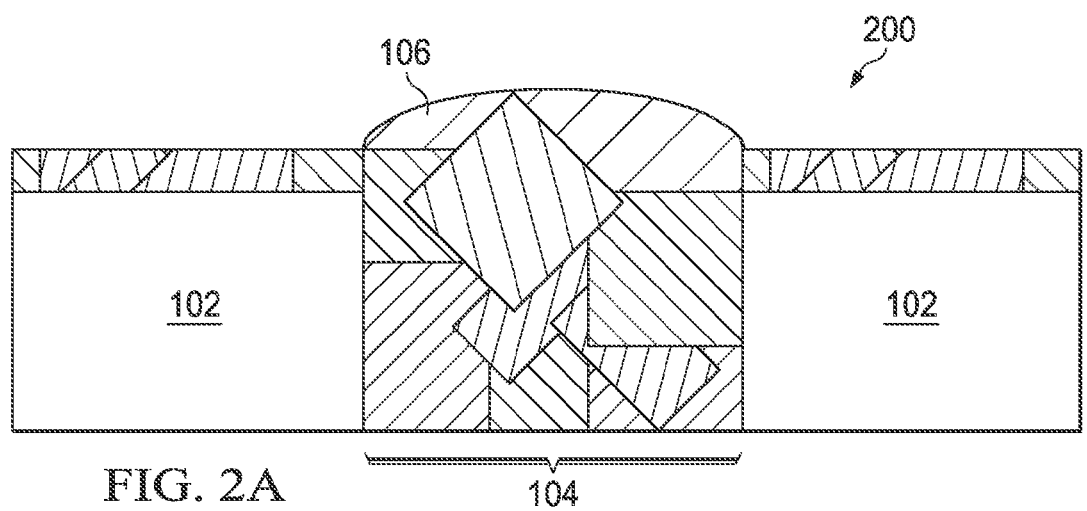
FIG. 2A is a cross-sectional diagram illustrating an embodiment of deposition of TSV material in preparation for creation of a barrier pad structure.

Referring now to FIG. 2A, TSV material 106 deposited on a substrate 102 in preparation for creation of a barrier pad structure 200 is shown in cross-section. In particularly useful embodiments, copper (Cu) may be deposited on the substrate 102 target surface by a chemical vapor deposition process. However, any conductive material may be advantageously used for a TSV 104, such as, but not limited to, gold (Au), nickel (Ni), nickel-gold alloys (NiAu), titanium (Ti), aluminum (Al), molybdenum (Mo), tantalum (Ta), tungsten (W) or the like. Similarly, any suitable deposition process may be used to deposit a conductive material for the TSV 104, including, but not limited to chemical vapor deposition (CVD), molecular beam epitaxy (MBE), sputtering, electroplating, or the like. The TSV material 106 will be reduced lower than the height of the via to form a bottom TSV pad.

Figure 2B:
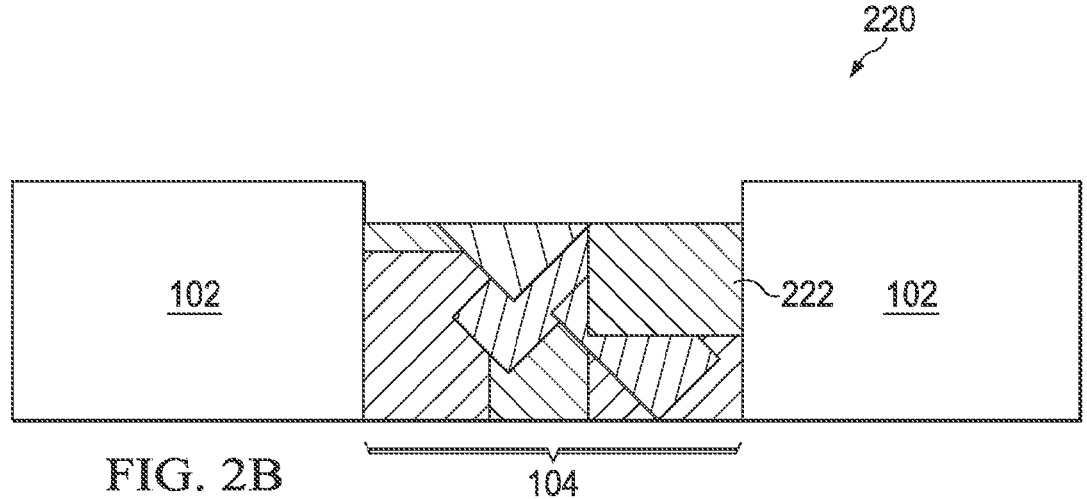
FIG. 2B is a cross-sectional diagram of a TSV structure after a metal only first chemical mechanical polish.

FIG. 2B illustrates a cross-sectional view of a TSV 104 structure after a first, metal-only polish 220. In particularly useful embodiments, the first polish will reduce the surface of the TSV material 222 below the surface of the substrate 102. Here, the object of the metal-only polish is to remove TSV material 106 without affecting the substrate 102. Such a metal only polish preferably creates a flat and even surface in the TSV material 222 so that subsequent layers have an even thickness with respect to the substrate 102 surface. Additionally, while the metal removal is referred to as a polish, physical abrasion is not required. A chemical polish, such as, but not limited to, nitric acid or ferric chloride etchant, may be advantageously employed. Alternatively, a well-known side effect of standard CMP processes that may be advantageously employed is dishing of copper. During a CMP the copper may be removed faster than the more durable substrate surface, resulting in a copper feature surface lower than the substrate surface.

Figure 2C:
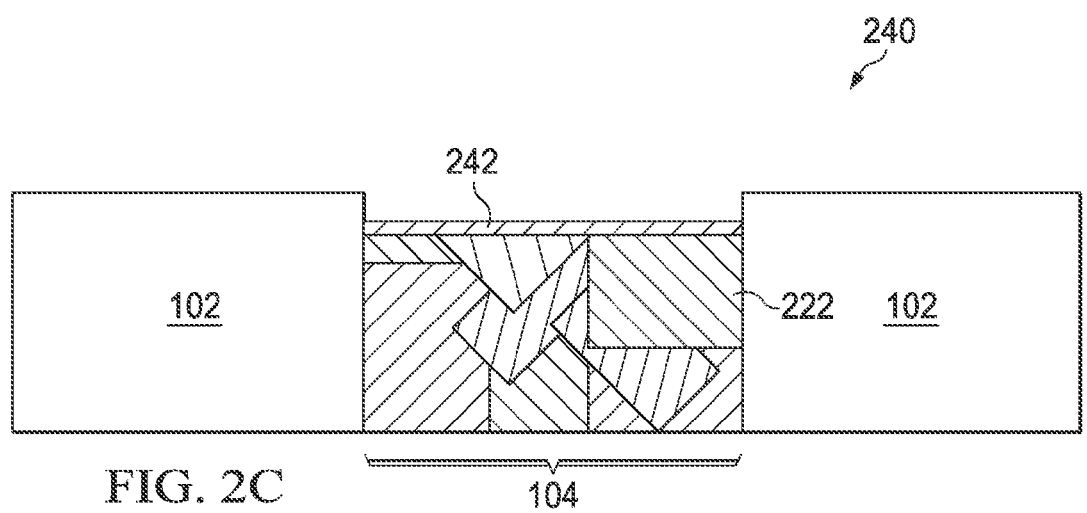
FIG. 2C is a cross-sectional diagram of a TSV structure with an embodiment of a barrier pad.

FIG. 2C illustrates a cross sectional view of a TSV structure with a barrier pad 242 applied 240. A barrier pad 242 may be formed of a conductive material, such as a metal, or any other material having a resistance low enough to suitably conduct electricity. Additionally, material having a crystal or grain structure dissimilar enough from the TSV 222 material to prevent the barrier pad from acting as a seed layer or crystal may be advantageous. For example, when using copper (Cu) TSV material 222, a barrier pad 242 of tantalum (Ta), cobalt (Co), titanium (Ti), nickel (Ni) or the like may be advantageously applied. Each of those specified metals are relatively inexpensive, and may be deposited using a chemical vapor deposition process, while exhibiting sufficient adhesion to the copper TSV material 222 and sufficiently low resistance. While the previously disclosed barrier pad 242 materials may be used in one or more embodiments, skilled artisans will recognize that any other suitable material may also be used as a barrier pad 242.

A barrier pad 242 may be deposited in any thickness suitable to prevent the bottom TSV pad 222 from affecting the crystal growth of a top TSV section. However, the barrier pad 242 should also be deposited in a thin enough layer to prevent large scale grain formation in the barrier pad 242 itself. Thus, the barrier pad 242 thickness of sufficient thinness may be selected to prevent barrier pad surface topography variations greater than a predetermined size. In one useful embodiment, the barrier pad 242 may be less than about 5 microns thick.

The barrier pad may also be deposited by any known or as yet undiscovered deposition method. For example, the TSV 104 via area may be masked so that a CVD process applies barrier pad 242 material only in the TSV 104 via. Masking may permit avoidance of a barrier pad 242 polishing step, however, a generalized metal deposition process may be used, followed by removal of the barrier pad 242 material from the surface of the substrate 102. For example, the barrier pad 242 may be deposited through electroplating, and any barrier pad 242 material may be removed from the surface of the substrate 102 by a CMP process. Alternatively, a plasma vapor deposition process may be used. Skilled practitioners will recognize that the various vapor deposition processes may result in barrier pad 242 material being deposited in the sidewalls of the TSV 104 via. Such sidewall deposits will be preferably thin enough in comparison to the TSV 104 via cross sectional area and top TSV pad 282 top surface area that the deposits will not interfere with the adherence of mounted elements to the top TSV 282 pad.

Figure 2D:
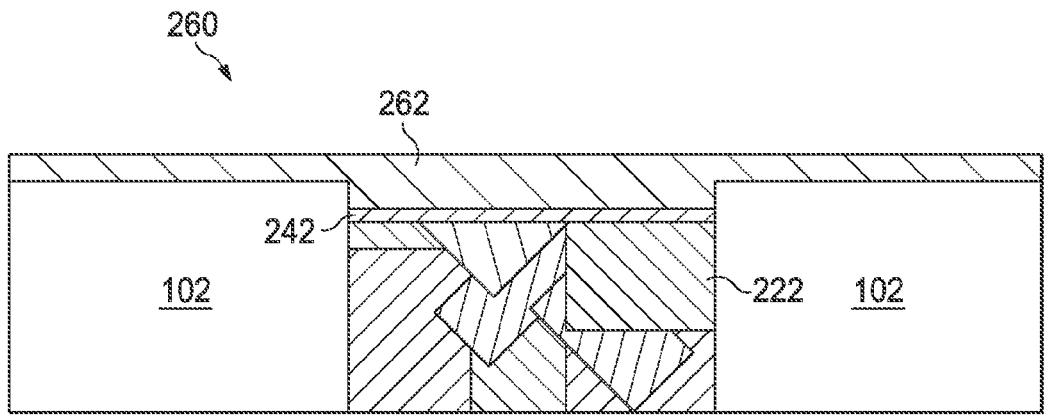
FIG. 2D is a cross-sectional diagram of a TSV structure with a second deposition of TSV material.

FIG. 2D illustrates a cross-section 260 of a TSV structure with a second deposition of TSV material 262. The second deposition of TSV material 262 will become the top TSV pad 282, which will advantageously be thin enough to prevent formation of crystal grain structures large enough to cause surface topography problems. In particularly useful embodiments, a top TSV pad 282 thickness of less than about 6 microns reduces surface topography features to within tolerable ranges, and particularly useful embodiments will have a top TSV pad thickness of 1 to 3 microns. Skilled artisans will recognize that the thickness of the top TSV pad 282 will dictate the maximum topography variation, and that a particular top TSV pad 282 thickness will associated with, or resulting in, a predetermined maximum topography variation. For example, depending on the top TSV pad 282 material, a 6 micron top TSV pad 282 thickness may result in surface topography variations of about 500 angstroms or less after heat treating.

Figure 2E:
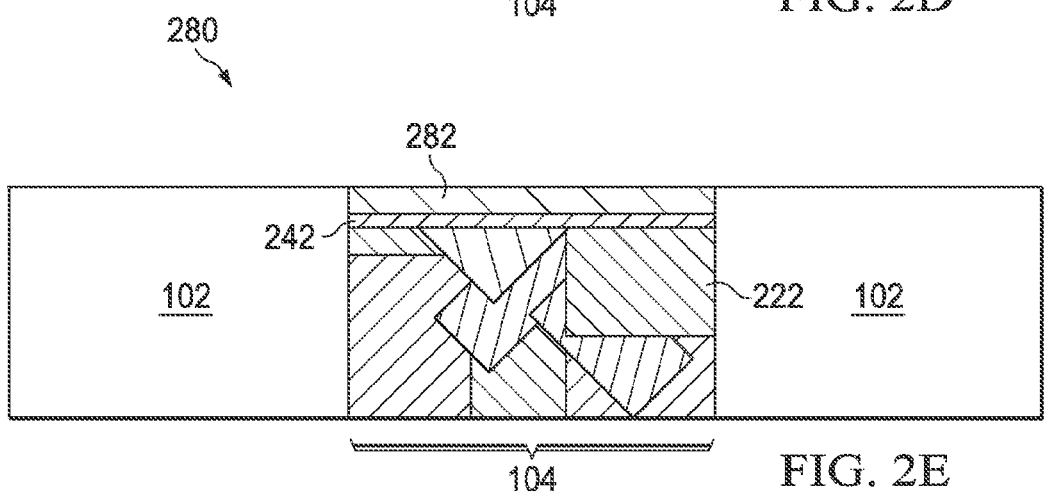
FIG. 2E is a cross-sectional diagram of a TSV structure with a barrier pad and after a second planarization.

FIG. 2E illustrates a cross-section of a TSV 104 structure with a barrier pad after a second planarization. In one embodiment, the second TSV material 262 deposition may be deposited via a CVD process, with TSV material deposited on the substrate 102 as well as the in the TSV 104. Polishing the second TSV deposition 262 to form the top TSV pad 282 may advantageously remove any excess TSV material from the substrate and top TSV pad 282 surfaces and smooth the top TSV pad's 282 upper surface to planarize it with the substrate 102 target surface.

Figure 4A:
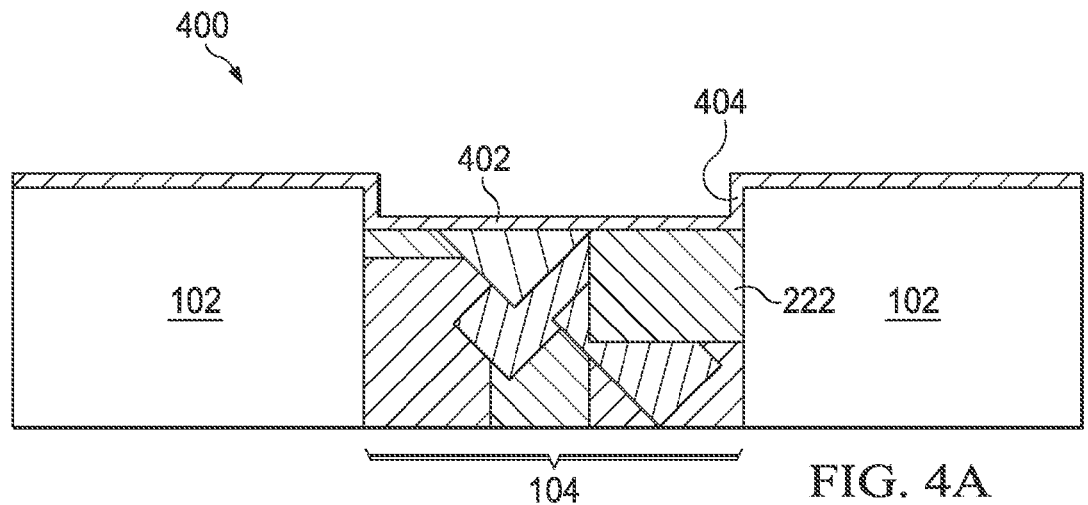
FIG. 4A is a cross-sectional diagram of a TSV structure with an alternative embodiment of a barrier pad.

FIG. 4A illustrates a cross-section of an alternative embodiment 400 of a barrier pad. In this embodiment, a substrate 102 and TSV 104 may be filled and prepared as shown in FIGS. 2A and 2B, and the barrier pad 402 material may be applied without precise masking. Such deposition may result in barrier pad 402 material deposited across the substrate 102, or with barrier pad 402 material being deposited within the via 104 over the TSV material 222 and on the via 104 sidewalls forming barrier pad sidewalls 404. Deposition of the barrier pad 402 material may be accomplished by any advantageous process, including, but not limited to, sputtering, CVD, PECVD, electroplating or the like. Skilled artisans will recognize that the presence of a barrier pad sidewall 404 would not significantly affect the performance of a top TSV pad 282.

Figure 4B:
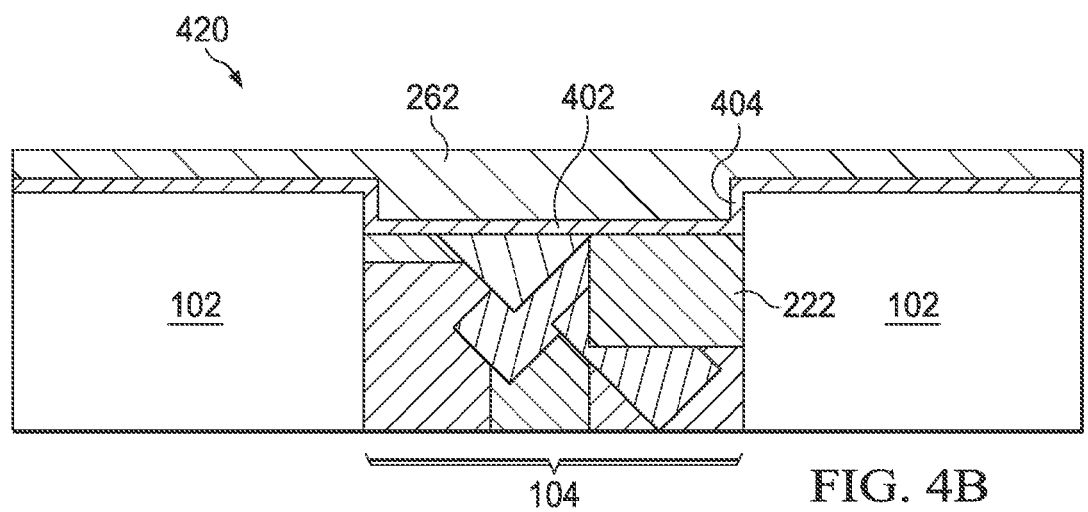
FIG. 4B is a cross-sectional diagram of a TSV structure with a second deposition of TSV material on an alternative embodiment of a barrier pad.
Figure 4C:
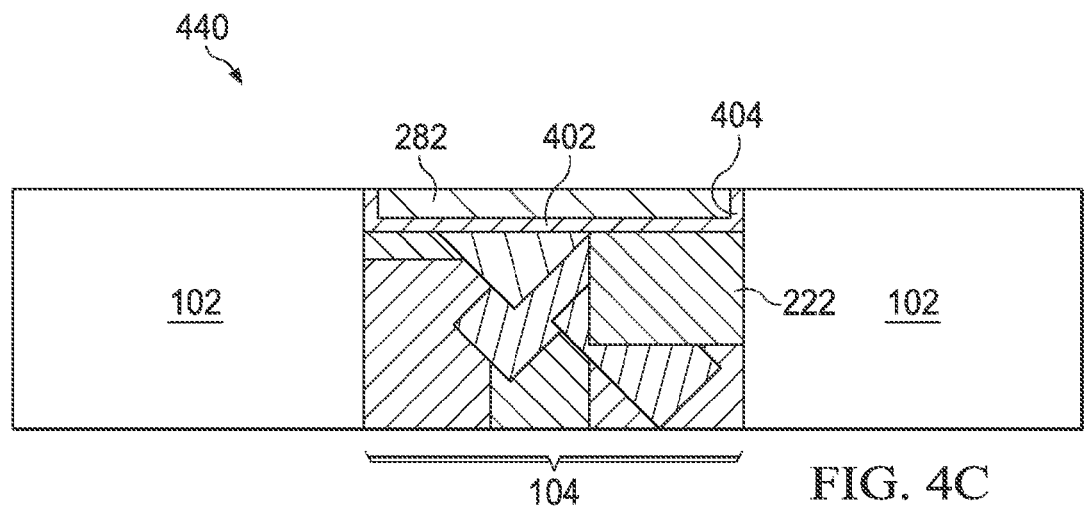
FIG. 4C is a cross-sectional diagram of a TSV structure with an alternative embodiment of a barrier pad and after a second planarization.

FIGS. 4B and 4C illustrate cross-sections of a TSV having an alternative embodiment of a barrier pad 402 with the second metal plating 262 applied 420 and planarized to form the barrier pad TSV 440. A second metal plating structure 262 may be applied directly onto the barrier pad 402 material, and may, in some embodiments, take advantage of any masking used to deposit the barrier pad 402 material. The second metal structure 262 deposition process may also be performed using any advantageous deposition technique without deviating from the present principles.

Both the second metal plating structure 262 and barrier pad 402 material may advantageously be planarized at the same time, or may be planarized in multiple steps. For example, the second metal plating structure 262 and barrier pad 402 material may be reduced to the level of the substrate 102 via a chemical mechanical polish, resulting in a top TSV pad 282 separated from the bulk of the TSV material 222 by a barrier pad 402 and barrier pad sidewalls 404.

Figure 3:
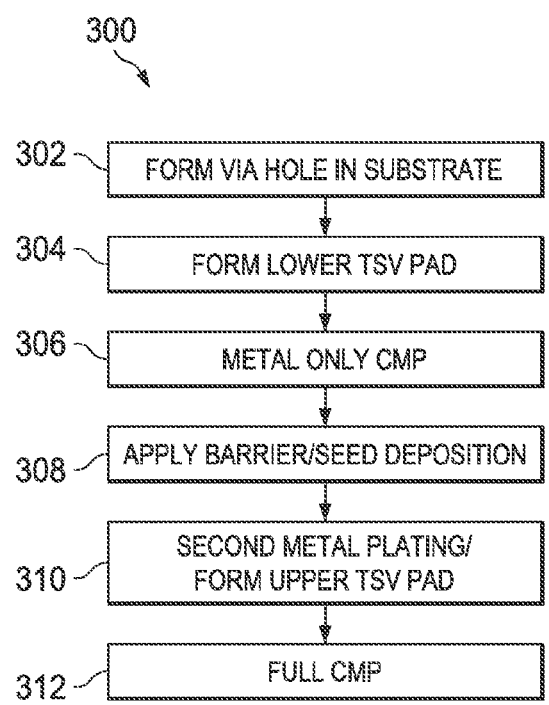
FIG. 3 is a flow diagram illustrating steps for constructing a TSV with a barrier pad.

FIG. 3 is a flow diagram 300 illustrating steps for constructing a TSV with a barrier pad. First, an existing substrate is prepared for creation of a TSV 104, including formation of a via hole in the substrate 102 in block 302. The via hole may be drilled, milled, chemically etched, or created by any other means. Additionally, any other substrate 102 preparation step may be performed at this junction, including, but not limited to, substrate 102 annealing, polishing, cleaning, doping, backside grinding, or the like. The initial metal plating to form the lower TSV pad 222 in block 304 is deposited after the substrate 102 has one or more via holes created. As discussed, supra, the first metal plating step may be CVD, electroplating, or any other suitable deposition method. Additionally, the TSV 104 via and substrate 102 may be masked prior to deposition to prevent excess TSV material 106 from being deposited in non-useful locations.

In block 306, the lower TSV pad 222 is polished, etched, or otherwise reduced, by, for example a chemical mechanical polishing (CMP) process. Skilled artisans will recognize that with a maximum preferable top TSV pad 282 thickness of 6 microns, and a maximum preferable barrier pad 242 thickness of about 1 micron, the surface of the bottom TSV pad 222 will, in one useful embodiment, be reduced below the surface of the substrate 102 by less than the thickness of the top TSV pad and barrier pad, or less than 6 microns. Preferably, the bottom TSV pad 222 will be reduced below the substrate surface between about 0.1 and 3 microns, to accommodate the preferred barrier pad 242 and top TSV pad 282 thicknesses. As the reduction in the TSV bottom pad 222 below the target surface of the substrate 102 creates space for the barrier pad 242 and top TSV pad 282, the final thickness of the top TSV pad 282 can be controlled by the distance the bottom TSV pad 222 is reduced, in combination with the thickness of the barrier pad 242.

A second metal plating structure 262 may be deposited in block 310 to form the top TSV pad 282, and surfaced or polished in block 312. Any suitable deposition process may be used for this deposition step, and that process need not be the same as for deposition of the barrier pad 242 or bottom TSV pad 222.

In an alternative embodiment, the barrier pad 242 may be the final pad applied to the TSV 104, and block 310 may be omitted. In such an embodiment, the barrier pad 242 may be deposited on a TSV bottom pad 222, and then reduced to a level where the preferred thickness of the barrier pad 242 is achieved at the surface of the substrate 102. Then, the full polish may be performed on the barrier pad 242 itself to surface the barrier pad 242 for attachment of connecting structures such as wire bonds or the like.

In particularly useful embodiments the final, top pad, whether the top TSV pad 282, or the barrier pad 242 will be surfaced to about the same level as the substrate 102. Additional TSV surface preparation steps may also be performed prior to bonding of an interconnection as well. For example, an anti-oxidation coating, such as an organic solderability preservative or palladium plating may be applied to a copper TSV pad to prevent copper oxidation. Alternatively a solder ball, solder paste, or a solder flux material may be applied in place or, or in addition to any other surface coating.

Although the present embodiments and their advantages have been described in detail, it should be understood that various changes, substitutions and alterations can be made herein without departing from the spirit and scope of the disclosure as defined by the appended claims. It will be readily understood by those skilled in the art that many of the features and functions discussed above can be implemented using a variety of materials and orders to the processing steps. For example, TSVs may be polished so that their upper surface is above or below the top surface of the substrate. As another example, it will be readily understood by those skilled in the art that many of the steps may be performed in any advantageous order while remaining within the scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, apparatuses, manufacture, compositions of matter, means, methods, or steps.

What is claimed is:

1. A method, comprising:
   providing an electrically insulating substrate with a via;
   forming a metal bottom through substrate via (TSV) pad in the via, the bottom TSV pad having a top surface less than about 6 microns below a target surface of the substrate;
   depositing a metal barrier pad in the via and on the top surface of the bottom TSV pad, wherein the top surface of the metal barrier pad is below the target surface of the substrate; and
   depositing a metal top TSV pad on the top surface of the metal barrier pad, where the top surface of the metal top TSV pad is about level with the target surface of the substrate;
   wherein the metal top TSV pad, the metal barrier pad and the metal bottom TSV pad completely fill the via.

2. The method of claim 1 wherein the forming the metal bottom TSV pad comprises at least depositing a metal and performing a metal only polish, wherein the metal only polish removes at least a portion of the deposited metal from at least the target surface of the substrate.

3. The method of claim 2, wherein the polish reduces a height of the metal bottom TSV pad so that the top surface of the metal bottom TSV pad is at least about 0.1 microns below the target surface of the substrate.

4. The method of claim 2, wherein the metal barrier pad is deposited with a thickness less than about 1 micron.

5. The method of claim 1, wherein the depositing the metal top TSV pad comprises at least depositing a metal and performing a polish, wherein the polish removes at least a portion of the deposited metal from at least the target surface of the substrate and reduces a height of the metal top TSV pad so that the top surface of the metal top TSV pad is about level with the target surface of the substrate.

6. The method of claim 1, wherein the metal barrier pad is selected from a group consisting of tantalum, cobalt, titanium, nickel.

7. The method of claim 1, wherein the metal top TSV pad and metal bottom TSV pad are each selected from a group consisting of copper, gold, nickel, tungsten and aluminum.

8. The method of claim 1, further comprising the step of applying an anti-oxidation coating to at least the top surface of the metal top TSV pad.

9. The method of claim 1, wherein the metal top TSV pad has a thickness resulting in a crystal structure that creates a topography variation at a top surface of the metal top TSV pad that is less than a predetermined maximum topography variation.

10. The method of claim 9, wherein the maximum topography variation is about 500 angstroms or less.

11. A method comprising:
 forming a bottom through substrate via (TSV) pad disposed in a via opening in a substrate;
 forming a barrier pad on a top surface of the bottom TSV pad, the top surface of the barrier pad being below a target surface of the substrate; and
 forming a top TSV layer over the barrier pad;
 planarizing the top TSV layer to form a top TSV pad in the via opening, the top TSV pad having a thickness less than a maximum pad thickness;
 wherein the maximum pad thickness is a maximum thickness for a pad that results in a crystal structure causing a topography variation at a top surface of the top TSV pad that is equal to or less than a predetermined maximum topography variation.

12. The method of claim 11, further comprising heat treating material in the via opening, wherein the barrier pad is formed with a thickness sufficient to prevent the bottom TSV pad from affecting a crystalline structure of the top TSV pad during the heat treating.

13. The method of claim 12, wherein maximum topography variation after heat treating is about 100 angstroms or less.

14. The method of claim 12, wherein the maximum topography topography variation is about 500 angstroms.

15. The method of claim 11, wherein the top TSV pad has a thickness of less than about 6 microns.

16. The method of claim 11, wherein the top TSV pad has a thickness between about 1 micron and about 3 microns.

17. A method, comprising:
 forming a conductive bottom through substrate via (TSV) pad in a via opening disposed in a substrate, the conductive bottom TSV pad filling a bottom portion of the via opening and having a top surface disposed below a target surface of the substrate;
 forming a conductive barrier pad on the top surface of the conductive bottom TSV pad, at least a portion of top surface of the conductive barrier pad being below the target surface of the substrate; and
 forming a conductive top TSV pad on the top surface of the conductive barrier pad, a top surface of the conductive top TSV pad about level with the target surface of the substrate, the conductive top TSV pad having a thickness resulting in a top surface of the conductive top TSV pad having a topography variation less than a predetermined maximum topography variation;
 wherein the top surface of the conductive top TSV pad is configured to accept attachment of an electrical connection; and
 wherein the conductive barrier pad comprises a material different from a material of the bottom TSV pad and the top TSV pad.

18. The method of claim 17, wherein the conductive barrier pad material is selected from a group consisting of tantalum, cobalt, titanium, nickel.

19. The method of claim 17, wherein the conductive top TSV pad material is copper and the bottom TSV pad material is copper.

20. The method of claim 17, wherein the conductive barrier pad has a thickness of less than about 5 microns.

* * * * *